United States Patent [19]

Mitterhummer et al.

[11] 4,057,459
[45] Nov. 8, 1977

[54] METHOD FOR MANUFACTURING MICRO-WIRING ARRANGEMENTS FOR CONTACTING SEMICONDUCTOR CIRCUITS

[75] Inventors: Gerhard Mitterhummer, Munich; Kurt Plehnert, Pullach, both of Germany

[73] Assignee: Siemens Aktiengesellschaft, Berlin & Munich, Germany

[21] Appl. No.: 616,148

[22] Filed: Sept. 24, 1975

[30] Foreign Application Priority Data

Sept. 27, 1974 Germany .......................... 2446368
July 2, 1975 Germany .......................... 2529576

[51] Int. Cl.$^2$ ............................................. C23F 1/02
[52] U.S. Cl. ............................... 156/630; 96/36.2; 96/48 R; 156/634; 156/656; 156/661; 156/901; 354/317
[58] Field of Search ............. 96/36.2, 48 R; 354/317; 156/8, 345, 629–634, 661, 664, 668, 656, 901, 902

[56] References Cited

U.S. PATENT DOCUMENTS 2,665,619  1/1954  Tuttle et al. ................... 354/317 X
3,774,521  11/1973  Beck ................................. 354/317

*Primary Examiner*—William A. Powell
*Attorney, Agent, or Firm*—Hill, Gross, Simpson, Van Santen, Steadman, Chiara & Simpson

[57] ABSTRACT

A method and apparatus for producing micro-wiring arrangements on a flexible, insulating carrier band for the purpose of contacting semiconductors characterized by providing a carrier band having at least one opening therein for subsequently receiving an assembly, a thin metal band bonded onto one side of the carrier band with a first layer of photosensitive varnish covering the metal layer and a second layer of photosensitive varnish covering the opposite side of the carrier band and any metal exposed through the openings therein, and after exposing the first layer with the desired pattern, treating the layer to uncover portions of the metal layer by floating the band across a surface of a treating bath such as a developing bath to contact the first layer without contacting the second layer with the developing material and creating a flow in the bath directed generally toward the first layer to contact the first layer and to thereby cause developing of the first layer to uncover portions of the metal layer. The method further includes using a similar device to remove the remaining portion of the first layer in a layer removing bath by floating the band across the surface of the layer removing bath without contacting the second layer with the liquid of the layer removing bath and while floating the band across the bath producing or creating a flow in the bath to contact the entire surface of the first layer to ensure removal thereof.

7 Claims, 8 Drawing Figures

METHOD FOR MANUFACTURING MICRO-WIRING ARRANGEMENTS FOR CONTACTING SEMICONDUCTOR CIRCUITS

BACKGROUND OF THE INVENTION

1. Field of the Invention

The present invention is directed to a method of manufacturing and a device used therewith with the method using photo-etching techniques to produce a micro-wiring arrangement on a flexible, insulating carrier band for the purpose of contacting semiconductor circuits in which the carrier band contains at least one opening for receiving an assembly and has at least one thin metal strip extending across the opening on one surface of the band.

2. Prior Art

In the manufacture of etched micro-wiring arrangements for the contacting of semiconductor circuits, it is well known to start with a flexible, insulating carrier band which has transfer perforations and openings to subsequently receive assemblies. Such a tape or carrier band is disclosed in U.S. Pat. No. 3,763,404. The carrier band or tape has a metal layer applied to one surface to form a laminated band and after the application of the metal layer, the laminated band is coated on both sides with a photosensitive varnish. The photosensitive varnish layer, which covers the metal layer and is the first layer, is then exposed through a corresponding photographic mask and developed so that it either produces a positive etching mask which exposes those portions of the metal layer which are to be etched away or produces a negative mask which is used during the applying of a final surface of etch resistant material such as by electrodeposition. When etch resistant material is applied to form the etching masks, the remaining portions of the first photosensitive varnish layer is completely removed to expose or uncover the portions of the metal layer which are to be subsequently removed. With the etching mask either being formed by the remaining portion of the first photosensitive varnish layer or being formed by the electrodeposited etch resistant material, the subsequent etching operation is performed to produce the desired wiring arrangement or circuit pattern. The photosensitive varnish layer, which is applied to the opposite side of the laminated band and is a second layer, is intended to protect during etching the portion of the metal foil or layer which extends across any of the openings such as those that receive the assembly and if the process includes the electrodepositing of the final surface layer, this layer also prevents the deposition of the etch resistant material on this portion.

When coating both sides or surfaces of the laminated band with the photosensitive varnish layers, inevitable differences in the thickness of the photosensitive varnish layers on each surface will occur and particularly the second layer on the other surface in the neighborhood of each of the openings in the band which are to receive the assemblies. This nonuniform layer thickness distribution presents problems during drying of the photosensitive varnish layers because either the thinner parts of the layers are overheated during drying and become brittle or the thicker parts of the layers are insufficiently dried. Photosensitive varnish layers, which have been rendered brittle, will lose their sensitivity to exposure. An inadequately dried photosensitive varnish will be dissolved by the developer even at the unexposed zones or portions. As soon as the second photosensitive varnish layer on the other surface is dissolved by the developer in the region of the assembly opening, a risk arises that the etching of the wiring structure circuit will produce unwanted removal of the metal strips of the metal layer which are to extend into or across the opening so that the desired wiring or circuit structure can no longer be produced with the proper shape or pattern. If, prior to etching, an electrodeposited final surface layer is applied on the exposed metal layer, then there exists a risk that unwanted deposition of metal will occur on the other surface on the position of the metal layer which extends across each of the openings so that during the subsequent etching step, the desired circuit or wiring arrangements will not be obtained. In addition to problems with unwanted removal of the second layer on the other surface during developing, similar problems will occur during the removal of the remaining portion of the first layer after the electrodeposition of the final surface. Thus, in order for the second layer on the other surface to perform its protective function during the etching operation, it cannot be dissolved during the step of removing the remaining portions of the first layer.

SUMMARY OF THE INVENTION

The present invention is directed to an improvement in the method of manufacturing a micro-wiring arrangement on the flexible, insulating carrier bands and to a device used in the method which method and device overcomes the above-mentioned difficulties.

The method includes providing a flexible carrier band having at least one opening therethrough for receiving an assembly, a metal layer bonded on one side of the carrier band with a first layer of photosensitive varnish covering the metal layer and a second layer of photosensitive varnish covering the other side of the carrier band and any portion of the metal layer exposed through each opening in the band, forming a wiring structure in the metal layer by using photo-etching techniques including exposing the first layer of photosensitive varnish with the desired pattern and developing the first layer prior to the etching step with the improvements comprising developing the exposed layer of photosensitive varnish without developing the second layer of photosensitive varnish by floating the band over a surface of the developer bath with the first layer contacting the bath and creating a flow in the bath of the developer in the direction generally toward said first layer to contact the first layer and to thereby cause developing of the first layer to uncover portions of the metal layer.

By virtue of the one sided development of the first photosensitive varnish layer which covers the metal layer, the method reliably ensures that the second photosensitive varnish layer does not come into contact with the developer and that the thicker zones of the second layer are not dissolved by the developer at the edges of the assembly opening. By preventing the dissolving of the second layer, particularly in the assembly openings, the process ensures the precise contoured and configuration of any of the fine conductor paths which extend across the opening or the ends of the fine conductor paths which extend over the edge of the opening.

The method of the invention also enables using a negatively acting photosensitive varnish for both layers on the laminated band without requiring any exposing of the second layer prior to developing the first layer. In one sided developing, the laminated band floats or slides over the surface of the developer bath with only the first photosensitive layer which covers the metal layer being contacted or wetted by the developer. This sliding or floating operation gently and uniformly takes place so that no developer is splashed and the second photosensitive varnish layer does not come into contact with the developer. The flow generated in the developer bath is directed toward the surface of the first layer and will reinforce this sliding effect. In addition, this flow continuously supplies fresh developer to the photosensitive varnish layer being developed so that development is intensified and accelerated.

In the preferred example of the method of the invention, after one sided developing of the photosensitive varnish layer, the uncoated zones or portions of the metal layer are provided with an etch resistant final surface and subsequently the remaining portions of the first photosensitive layer are removed by floating the band with the first layer in contact with a surface of a layer removing bath which has a flow directed at the first layer. This one sided removal of the first photosensitive varnish layer without requiring any proceeding exposure process is simple to perform and is substantially more economical than the previously known removal processes which required secondary exposure of the portion to be removed and a one sided secondary development.

Advantageously, the laminated band will be coated on both surfaces with positively acting photosensitive varnishes and an aqueous-alkaline developer bath will be used. The positively acting photosensitive varnish is distinguished by a high resolving power and the method of the invention in using an aqueous-alkaline developer offers substantial advantages over the previously known spray developing systems. For example, it is possible to dispense with the addition of anti-foaming agents in the developer bath. Also, the exhaustion of the aqueous-alkaline developer by carbon dioxide absorbed from the air is substantially reduced compared to the exhaustion which occurs in spray development processes. The same advantages also occur in the one sided layer removal portion of the method when an aqueous-alkaline layer removal bath is used.

A device of the invention which enables the treating which is selected from the group consisting of either developing or removing the developed layer, utilizes a vessel for containing a bath of treating liquid having side walls terminating in a rim, said vessel having an overflow channel surrounding the side walls to catch liquid flowing over the rim, at least one circulation pump having an intake line receiving liquid from the overflow channel and an output line connected to the vessel, and means for guiding a band to float on the surface of the treating liquid in the vessel so that the treating liquid is flowing toward the surface to be treated and overflows the rim of the side walls to cause contact with the surface of the band facing the bath. This device enables the band to be guided to float over the vessel and with only the bottom or first photosensitive layer being wetted by the developing agent or the layer removal agent. The upper or second layer does not come into contact with the developer or the layer removing liquid and its protective function will not be impaired by these two treating liquids. The flow which is created by the circulation pump is directed toward or against the bottom or first layer. The developer or layer removing agent or liquid which flows over the top edge or rim of the bath vessel is collected in the overflow channel and recycled by a circulation pump to the vessel. This continuous flow of the agent supports the sliding of the band on the surface of the bath and also accelerates the treatment process of the layer. The device in accordance with the invention is particularly suited for incorporation into an automatic production process because all the operations take place automatically and it is only necessary to check the level of supply of the treating agent from time to time and to make replenishments as necessary.

Preferably, the bath vessel will contain a perforated plate beneath the bath surface and the treating agent which is pumped in the vessel via the circulation pump, flows through the individual holes of the perforated plates so that a uniform flow is directed toward the bath surface. By giving the bottom of the vessel a funnel-like configuration terminating in a lower point, the uniformity of the flow and therefore the uniformity of the contact of the agent with the floating band is further improved.

Advantageously, the top rim of the vessel is flared outward so that it diverges downwardly from the inner surface of each of the walls to promote a uniform flow of the agent gently over the rim and into the overflow channel. In addition this design of the rim causes the agent after flowing along the band and over the rim to be quickly directed into the overflow channel.

In the preferred embodiment of the device in accordance with the present invention, the suction line or input line of the circulation pump is connected via a reservoir to the overflow channel. By storing additional developing agents or layer removing agents in the reservoir, any losses in the amount of agent are compensated for so that replenishment of the treating agent is only required at greater intervals. Since entrainment of air into the reservoir from the overflow channel will cause foaming of the treating agent and particularly the aqueous-alkaline agent, a throttle valve is preferably provided between the reservoir and the overflow channel. By appropriate adjustments of the throttle valve, a back pressure can be applied to the treating agent in the overflow channel and prevents air from being entrained into the reservoir. By preventing the entraining of air, the addition of anti-foaming agents will not be required. Furthermore, by preventing the formation of foam, the exhaustion of the aqueous-alkaline developer or layer removal agent by the absorption of carbon dioxide from the air is drastically reduced.

The preferred embodiment also includes arranging the feed line to open into the reservoir at a point below the minimum bath level therein and such arrangement further reduces the changes of foaming.

The delivery or output line of the circulation pump is preferably provided with a filter which will remove residue and foreign bodies from the treating agent which bodies could impede either the developing operation or the layer removal operation.

A further advantage of the preferred embodiment of the invention is that the output or delivery line of the circulation pump will contain a regulating valve so that the rate of circulation of the treating agent can be regulated. In adjusting the rate of circulation to obtain optimum conditions, consideration is given to various different factors such as the particular photosensitive varnish being used, the thickness of the varnish layer, the bath composition, the length of the bath vessel and the speed of movement of the band.

DESCRIPTION OF THE PREFERRED EMBODIMENT

Figure 5:
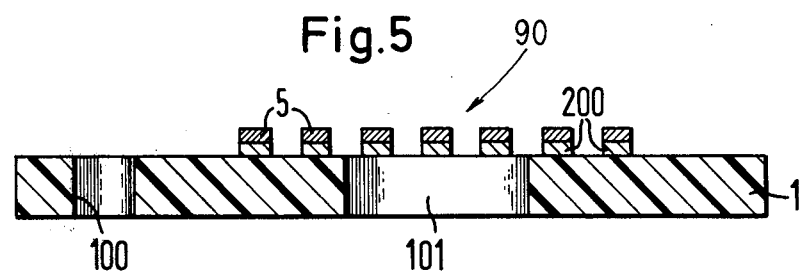
FIG. 5 is a view of the sheet after completing the etching process and the removal of the second layer.

The principles of the present invention are particularly useful when incorporated in a method for producing a microwiring arrangement or device generally indicated at 90 in FIG. 5. The arrangement 90 includes a flexible, insulating carrier band 1 having at least one opening 101 extending therethrough for receiving an assembly and has a circuit or wiring pattern 200 which has portions that either extend across the opening 101 or over an edge and into the opening 101. In addition to the opening 101, the device 90 may include apertures or openings 100 to enable through connection between the surfaces of the device.

To obtain the arrangement 90, the flexible, insulating carrier band 1 is provided with at least one opening 101. A metal layer 2 is applied or bonded to one surface thereof in a conventional manner. A first layer 3 of photosensitive varnish is applied to cover the metal layer 2 and a second layer 4 of the same type of photosensitive varnish is applied on the opposite surface of the band 1 and covers any rear surface portion 2' of the metal layer 2 which extends over the opening 101 and is exposed thereby. The through openings or holes 100 for a system of perforations are punched through the blank before applying the metal layer 2 and the first and second photosensitive layers 3 and 4. The metal layer 2 is preferably a copper foil. The first and second layers 3 and 4 of photosensitive varnish are preferably applied by a single dipping operation and are preferably positive acting photosensitive varnishes which are known and an example of a positive acting photosensitive varnish is varnish AZ-111 which is produced and sold by the Shipley Company, Inc.

Figure 1:
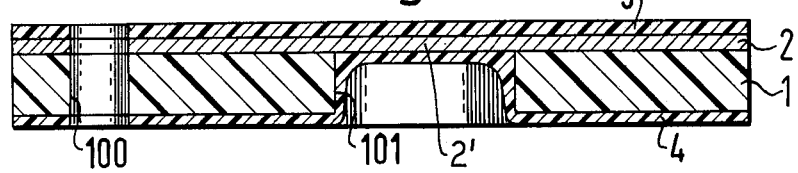
FIG. 1 is a cross section of a sheet prior to beginning the method of the present invention.
Figure 2:
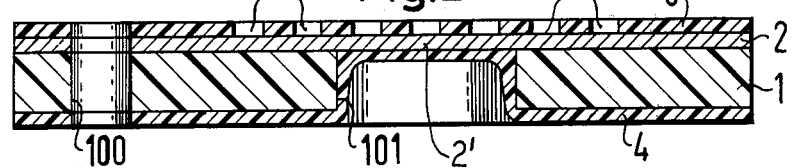
FIG. 2 is a cross section of a sheet of FIG. 1 after developing of the first layer according to the method of the present invention.

The blank of FIG. 1 has the first layer 3 exposed with the desired pattern and then is subjected to a developing process which only develops the photosensitive layer 3 to remove the exposed portions of the layer 3 to uncover zones or portions of the metal layer 2 which zones or portions are indicated at 300. In order to prevent developing or removal of any of the layer 4, particularly that portion of the layer disposed in the opening 101, the laminated blank is developed by floating it across a developing bath with the layer 3 contacting the bath and the upper layer 4 being free from contact with the bath. Preferably, if the photosensitive layers are positive acting photosensitive varnish, the developing bath is aqueous-alkaline developer.

Figure 3:
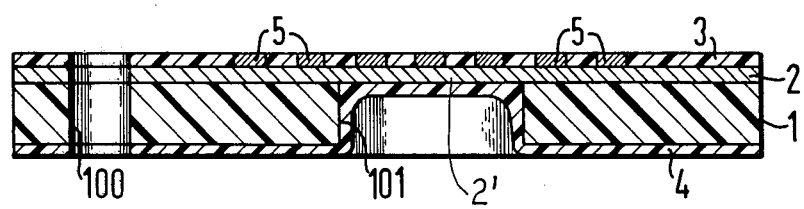
FIG. 3 is a cross section of the sheet of FIGS. 1 and 2 illustrating depositing of an etch resistant material.

Subsequent to developing the varnish layer 3 to provide the zones or portions 300 which are free of the layer 3, an etch resistant final surface layer 5 (FIG. 3), for example tin, is applied to the uncovered surface portions of the copper foil 2 by electrodeposition of metal (FIG. 3). The rear surface 2 of copper foil 2 which extends over the openings 101 is protected from the application of the etch resistant material due to the presence of the photosensitive layer 4 which prevents deposition on the rear surface 2' of the foil 2 which extends across the openings 101.

Figure 4:
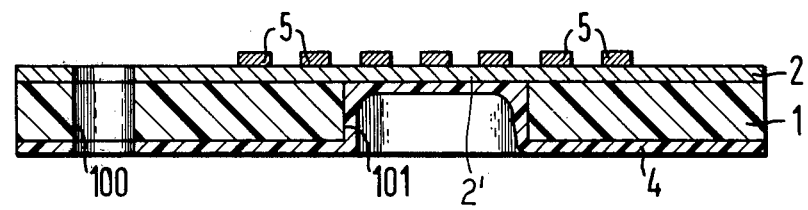
FIG. 4 is the cross section of the sheet of FIG. 3 after removal of the remaining portions of the first layer.

After applying the etch resistant material 5, the remaining portions of the exposed developed layer 3 are completely removed to produce the blank as illustrated in FIG. 4. While complete removal can be carried out by a secondary exposure of the layer 3, preferably, the varnish layer 3 will be removed without any prior exposure, by a one sided layer removal operation. In this context, the laminated blank is floated with the metal side or the first layer 3 extending downward and in contact with the surface of the layer removal bath which bath has a flow toward the surface of layer 3. in the layer removal bath, for example an aqueous-alkaline removal agent will be used. During this one sided layer removal operation, the opposite photosensitive layer 4 remains out of contact with the layer removing agent so that its protective function during the subsequent etching operation will not be impaired.

After removing the layer 3, the metal or copper layer 2 (FIG. 4) has an etching mask which is formed solely by the etch resistant material 5. The blank is subsequently etched to remove the copper which is not covered by the etch resistant material 5 to produce circuit pattern 200. Due to the presence of the second layer 4, the metal or copper layer 2 is only etched on one side in the etching bath. Subsequent to the etching step, the blank is passed through a second layer removal operation which does not need to be a one sided layer removal operation to remove the second layer 4 of protective photosensitive material and produce the device 90.

Figure 6:
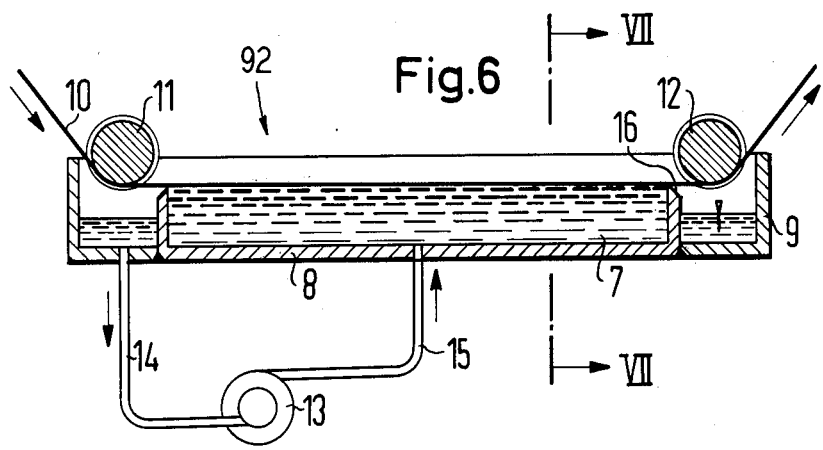
FIG. 6 is a longitudinal cross section through a device for one sided treating of the layer in accordance with the present invention.
Figure 7:
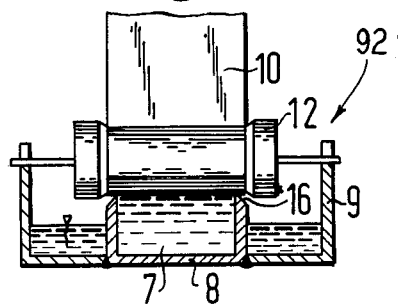
FIG. 7 is a cross section taken along lines VII—VII of FIG. 6.

An embodiment of a device for obtaining either a development of one layer without contacting or developing the second layer or to remove the first layer without removing any of the second layer is generally indicated at 92 in FIGS. 6 and 7. In the embodiment of the device 92, a vessel 8 has side walls terminating in a rim and receives a bath 7 of a treating agent which may be selected from a group consisting of a developing agent or layer removal agent. Surrounding the side walls, the device 92 has an overflow channel 9. The device 92 further includes at least one circulation pump 13 which has an input line 14 extending to the overflow channel 9 and has an output line 15 extending to the path so as to return the liquid, which overflows the rim of the vessel, to the bath 7. A band 10 of the material such as illustrated in FIG. 1 is moved to float across the upper surface of the bath 7. To facilitate the floating of the band 10, guide means comprising a pair of spaced guide rollers 11 and 12 are provided and mounted for rotation and each of the rollers 11 and 12 is provided with flanges to guide the movement of the band across the vessel 8. As illustrated in FIG. 7, the vessel 8 is configured to have a width slightly less than the width of the band 10 and the flanges on the rollers such as 12 maintain the band with the lateral edges being disposed over the rim of the vessel 8.

By means of circulation pump 13, the liquid or agent in the overflow channel 9 is returned to the bath and the pump 13 causes a continuous circulation of the treating agent so that it flows upward into contact with the lower surface of the band 10 and over the rim into the channel 9. To facilitate a gentle and uniform overflow of the agent, the rim is provided with flared edges illustrated at 16 which are diverging from the inner surface of each of the side walls downwardly in a slanting configuration. With the gentle and uniform overflow, a reduction in foaming and splashing of the agent is achieved and this reduction is particularly important when using an aqueous-alkaline agent. With the band 10 floating on the upper surface, the entire surface of the band facing the bath 7 will be contacted by the liquid of the treating agent as the liquid is overflowing the edges of the rim of the vessel 8, but the upper or top layer will not be contacted by the treating agent.

Figure 8:
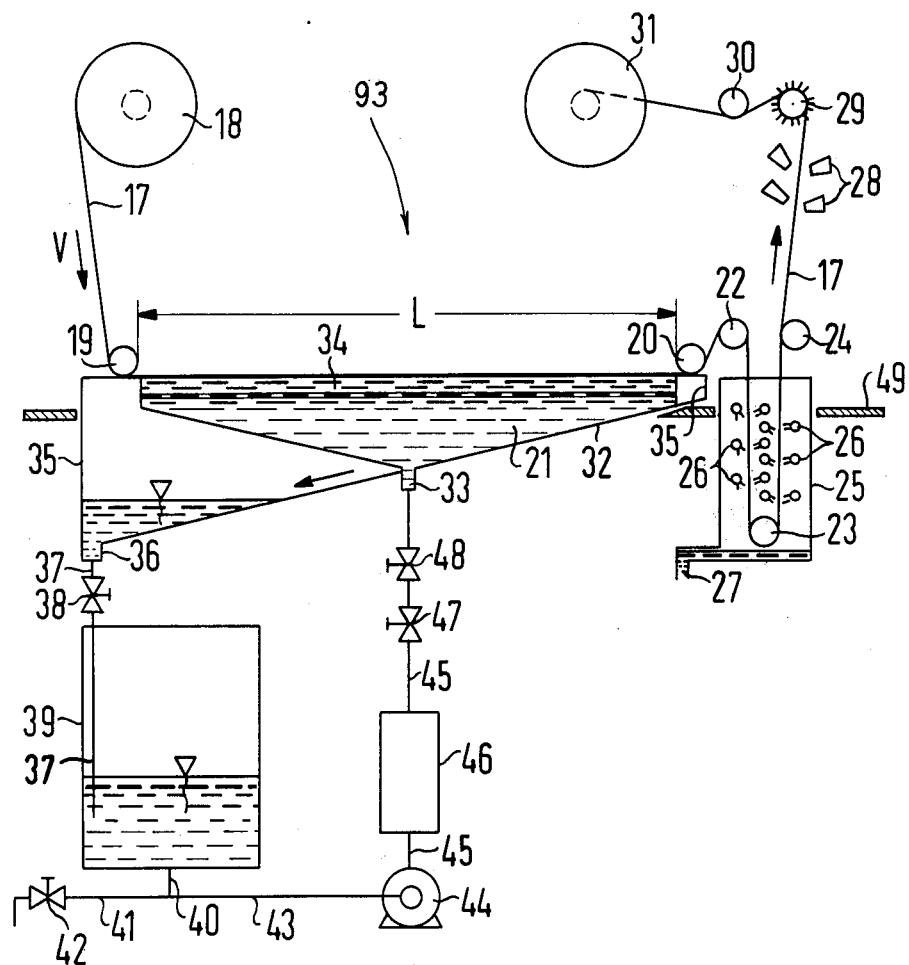
FIG. 8 is a schematic illustration of a complete installation for one sided treating of a band in accordance with the present invention.

An embodiment of the treating device which is a complete installation is generally indicated at 93 is schematically illustrated in FIG. 8. This insulation can be utilized for either developing one surface or layer on a band 17 or for removing the layer from the band 17. As illustrated, the band 17 is unreeled from a supply reel 18, passes through the guide roller 19 across an upper surface of the bath 21 which is contained in a vessel 32 on the second guide roller 20. From the guide roller 20, the band passes over rollers 22, 23 and 24 in which roller 23 is disposed in a vessel of a rinsing device 25 which has nozzles 26 for spraying a rinsing liquid such as water and a drain 27. After the band has passed over the rollers 22, 23 and 24 and has been rinsed, it is taken through a drying zone, which is illustrated as a plurality of nozzles 28 for compressed air and over a driven tooth drum 29. From the drum 29 the band 17 passes over a further roller 30 to a take-up reel 31.

The bath 21 of treating material whether it is a developing agent of a layer removing agent is contained in the vessel 32 which has a funnel-shaped bottom converging to a low point having a connection 33. The vessel has a perforated sheet 34, which extends across the vessel and is disposed beneath the upper surface of the bath. The side walls of the vessel 32 are connected with an overflow chamber or channel 35 which has a form of an assymetrical funnel whose lowest point is provided with a connection 36. The connection 36 of the overflow channel 35 is connected by a delivery line 37 which has a throttle valve 38 to a reservoir 39. From the bottom of the reservoir 39, a line 40 is connected to a junction which connects line 40 to both a discharge line 41 which has a discharge valve 42 and to an input or suction line 43 for a circulation pump 44. The circulation pump 44 has an output or delivery line 45 which may be provided with a filter 46, a shut-off valve 47 and a regulating valve 48 and extends to the connection 33 to reintroduce the liquid from the reservoir into the bath 21. As illustrated, the device 93 along with the rinsing device 25 are mounted on a common frame which is only illustrated by a table 49.

The speed or rate of feed of the band 17 sliding over the surface of the bath 21 is adjusted by means of the driven tooth drum 29. In adjusting the speed of the driven drum 29, care is taken to consider the length L during which the band 17 is contacting the liquid of the bath 21, the nature and thickness of the photosensitive layer which is being treated, the composition of the bath and the adjustment of the regulating valve 48 so that desired conditions for treating such as development or layer removal are obtained. The rate of flow of the agent in bath 21 and their rate of flow toward the band 17 is controlled by adjusting the regulating valve 48. During circulation of the treating agent, the liquid or agent which flows over the top or rim of the vessel 32 is all caught in the overflow channel 35 and then directed into the reservoir 39. The throttle valve 38 in the line 37 is adjusted to provide a back pressure on the liquid in the channel 35 so that air is not introduced into the reservoir 39. Furthermore the mixing of the liquid with the air is prevented by the assymetrical funnel-like form of the overflow channel 35 which causes a certain height of the level of the liquid over the connection 36. In addition to preventing mixing the liquid with air, the discharge line or drain line 37 is arranged to extend into the reservoir 39 to a level which is below the minimum level of fluid that will be in the reservoir.

By providing the filter 46 in the discharge line 45 of the group 44, any residues or foreign bodies which are in the recirculated treating agent or liquid are removed and will not interfere with the subsequent treating of the band 17 as it is floating or sliding across the upper surface of the bath 21.

The funnel-like design of the bottom of the vessel 32 promotes a uniform distribution of the treating agent as it flows from the connection 33 and produces a uniform contact with the band 17 moving over the upper surface of the bath. The perforated plate 34 also aids in obtaining a uniformity of the flow of treating liquid which is directed toward the bottom surface of the band 17 to improve a uniformity of contact of the treating liquid with the layer to be treated.

As mentioned above, the additional liquid to the bath 21 by the pump 44 causes the bath to continuously overflow its upper rim into the overflow channel. Thus, the liquid of the bath 21 is continually overflowing the rim of the vessel and being circulated back into the bath. The presence of the reservoir 39 provides a sufficient amount of make up or resume treating agent so that the interval between necessary replenishment of the treating agent are greatly increased.

Although various minor modifications may be suggested by those versed in the art, it should be understood that we wish to employ within the scope of the patent granted hereon, all such modifications as reasonably and properly come within the scope of our contribution to the art.

We claim:

1. In a method of manufacturing micro-wiring arrangements on a flexible, insulating carrier band for the purpose of contacting semiconductor circuits, said method including providing a flexible carrier band having at least one opening therethrough for receiving an assembly, a metal layer bonded to one side of the carrier band with a first layer of photosensitive varnish covering the metal layer and a second layer of photosensitive varnish covering the other side of the carrier band and any portion of the metal layer exposed through each opening in the band, and forming a wiring structure in the metal layer by using photo-etching techniques including exposing the first layer of photosensitive varnish with the desired pattern and developing the exposed first layer prior to an etching step, the improvements comprising said step of developing the exposed first layer of photosensitive varnish being accomplished without developing the second layer of photosensitive varnish by floating the band on a surface of a developer bath with the first layer contacting the surface of the bath and creating a flow within the bath of the developer in a direction generally toward said first layer to insure contact of the first layer and to thereby cause developing of the first layer to uncover portions of the metal layer.

2. In a method according to claim 1, wherein both the first and second layers of photosensitive varnish are positively acting photosensitive varnish and wherein the developing bath is an aqueous-alkaline developer bath.

3. In a method according to claim 1, wherein said bath is received in a vessel having side walls terminating in a rim, wherein the step of floating includes guiding the band with the first layer contacting the bath adjacent to the rim of the side walls, and wherein the step of creating a flow causes the bath to overflow the rim of the vessel and includes catching the overflow, applying pressure to the overflow and re-introducing the overflow to the vessel so that the bath is continually overflowing the rim of the vessel during the developing process.

4. In a method according to claim 1, which includes subsequent to the step of developing the first layer of photosensitive varnish to produce uncovered portions of the metal layer, applying an etch resistant final surface layer to the uncovered portions of the metal layer, and thereafter removing the remaining portions of the first layer of photosensitive varnish by floating the band on a surface of a layer removing bath with the first layer in contact with the surface of the bath and creating a flow within the layer removal bath generally in the direction of the first layer to insure contact of the surface of the first layer with the material of the layer removal bath to remove the remaining portions of the first layer of photosensitive varnish.

5. In a method according to claim 4, wherein the layer removing bath is an aqueous-alkaline layer removing bath.

6. In a method according to claim 3, wherein both said first and second layers of photosensitive varnish are positively acting photosensitive varnish and wherein the developer bath is an aqueous-alkaline developer bath.

7. In a method according to claim 6, wherein the layer removing bath is an aqueous-alkaline layer removing bath.

* * * * *